Dec. 20, 1966 A. H. BOTT 3,293,571
VARIABLE REACTANCE SOLID STATE FREQUENCY MODULATION SYSTEM
Filed Dec. 6, 1963
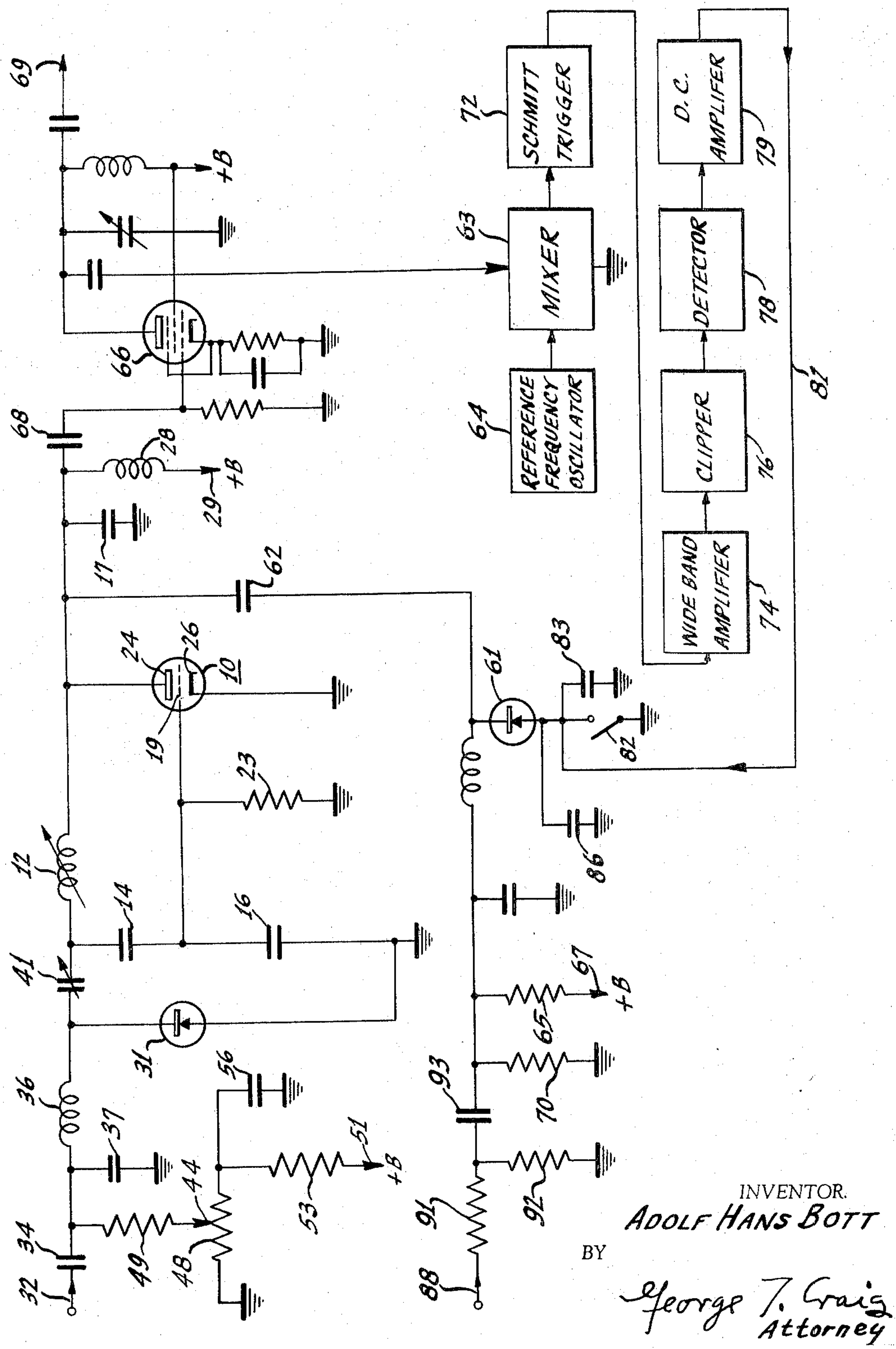
INVENTOR.
ADOLF HANS BOTT
BY
George T. Craig
Attorney

United States Patent Office 3,293,571
Patented Dec. 20, 1966

3,293,571
VARIABLE REACTANCE SOLID STATE FREQUENCY MODULATION SYSTEM

Adolf Hans Bott, Cherry Hill, N.J., assignor to Radio Corporation of America, a corporation of Delaware Filed Dec. 6, 1963, Ser. No. 328,753
2 Claims. (Cl. 332—29)

The present invention relates to frequency modulation of an oscillator, and more particularly to a novel mean for oscillator modulation including a solid state electronic device.

An object of the present invention is to provide for frequency modulation of an oscillator by employing a solid state electronic device in a novel manner as a modulator.

Another object of the present invention is to provide novel means for effecting frequency modulation of an oscillator by employing a reactance diode in which all or a part of the back-biasing voltage is produced by rectifying the alternating current output of the oscillator.

There are several known methods of producing frequency modulation of an oscillator. One of these uses a reactive electronic device, such as a diode, which is completely reverse-biased. The reactive device is substantially a pure reactance provided that the unidirectional bias voltage is always larger than the highest radio-frequency (R.F.) voltage developed across the reactive device. The modulating waveform may be applied in series with the diode. The radio-frequency carrier deviation is proportional to the fourth root of the modulating voltage and is produced by virtue of capacitance variations of the diode.

Another known method of producing frequency modulation is to use a resistive electronic device, such as a diode, which is forward-biased. The forward bias of the diode will permit changes only of the ohmic resistance of the diode and, when combined with a suitable capacitor, frequency modulation of the radio frequency carrier is obtained when a modulating signal is applied. The modulating radio frequency voltages should be small relative to the D.-C. biasing voltage.

In accordance with the present invention frequency modulation is effected by introducing changes in the reactance and in the resistance of a diode device which act on the resonant frequency-determining circuit of a source of radio frequency waves, such as an oscillator.

In practicing the present invention a reactive diode is coupled to the frequency-determining circuit of an oscillator and arranged so that back-biasing voltage is developed as a result of self-rectification of the radio frequency carrier of the oscillator. This back-biasing voltage does not back-bias the reactive diode during part of the negative half cycle of the radio frequency carrier so that some current flows through the diode. The change in the ohmic resistance of the diode in conjunction with an associated capacitor contributes in part to frequency modulating the oscillator. The change in capacitance of the diode is also used to effect frequency modulation of the oscillator. To reduce modulation distortion to a negligible value some amount of fixed back-bias voltage is added to the biasing voltage developed by rectification of the carrier.

The invention will be described in greater detail by reference to the accompanying drawing in which:

The single figure is a schematic diagram of a frequency modulated oscillator embodying the present invention.

By way of example a vacuum tube oscillator is shown, but it will be understood that the invention is equally applicable to a frequency modulated oscillator in which the active electronic device is a transistor or other semiconductor device instead of a tube. The oscillator tube 10 is connected as a series-tuned grounded-cathode Colpitts oscillator in which an adjustable inductor 12 in series with a capacitor 14 is employed as the resonant frequency determining circuit. The resonant circuit 12–14 is shunted by voltage divider capacitors 16 and 17 in series. The junction of capacitors 14 and 16 is connected to the grid 19 and one end of grid resistor 23. The resonant circuit 12–14 is connected between the anode 24 and the grid 19. The end of the grid resistor 23 not connected to the grid 19 and the cathode 26 are both connected to a voltage reference point in the oscillator such, for example, as ground. Anode voltage is supplied through a choke 28 from a terminal 29. The oscillator is tuned to the desired center frequency by adjustment of the inductor 12.

Frequency modulation of the oscillator is accomplished by the combined resistance and capacity changes of a variable reactance diode 31 when a modulating signal appears at the terminal 32. The modulating signal path includes a coupling capacitor 34 and a radio frequency choke 36. A small capacitor 37 provides a path to ground for the oscillator carrier so that it will not appear in apparatus (not shown) preceding the terminal 32. This apparatus will, in general, include the usual equipment to provide frequency modulation program material or sound accompaniment.

The variable reactance diode 31 may be a silicon diode and in two available forms, among others, it is known as a "Varactor" or "Varicap." A diode suitable for use as the diode 31 is sold commercially by Pacific Semiconductors, Inc. under type No. PC116. The diode 31 has its anode connected to ground and is connected in series with a trimmer capacitor 41 from the junction of inductor 12 and capacitor 14 to ground. The modulating input is applied across the diode 31 to ground.

Self bias of the diode 31 is supplied by rectification of the radio frequency carrier output of the oscillator to provide a bias voltage which appears across and is stored by the capacitor 37.

In the embodiment shown in the drawing, capacitor 34 also serves as a storage capacitor for the self biasing voltage. However, in other uses of this invention where a capacitor corresponding to the capacitor 34 is not present capacitor 37 provides sufficient storage. The self biasing voltage is in a direction to back-bias the diode 31.

In addition to the self bias developed by rectification of the radio frequency carrier, a fixed back-bias obtained from the slider 44 of a potentiometer resistor 48 is applied to the diode 31. A resistor 49 is connected between the slider 44 and one end of the choke 36. The potentiometer resistor 48 is grounded at one end and connected to a source of positive potential as indicated schematically at 51 through a resistor 53. A decoupling capacitor 56 is connected from the junction of the resistors 48 and 53 to ground. The fixed positive bias on the cathode of the diode 31 adds to the positive bias developed as a result of radio frequency carrier rectification.

The sum of the self and fixed bias voltages is insufficient to back-bias the diode during a part of the negative half cycle of the radio frequency carrier. The amount of self bias is determined by the portion of the radio frequency cycle during which the diode 31 is conductive. The diode is nonconductive over the remaining portion of the cycle. The loading determines the angle of conduction of the diode by the load it imposes. In the illustrative example, loading is provided by the resistor 49.

In operation of one embodiment of applicant's invention using a type PC116 diode as the diode 31 with component values given by way of example at the end of the present specification, a self bias voltage in the neighborhood of 10 volts is developed across the diode 31. In the carrier rectification process resistor 49 serves as a load resistor and the capacitors 34 and 37 are the storage or filter capacitors. The fixed bias in the presently discussed embodiment is 3 volts. The modulating signal has an alternating current peak-to-peak voltage of 100 millivolts appearing at the junction of resistor 49 and capacitor 37. This modulating voltage swings around the sum of the fixed and self bias voltages.

In the operation of the illustrative embodiment of the present invention, it has been determined that by back-biasing the diode 31 except during a part of the negative half cycle of the radio frequency carrier so that the modulating signal changes both the reactance and resistance of the diode the harmonic distortion in the output of the modulator is substantially less than when either the reactance or resistance alone is varied. This is a distinct advantage, particularly with a wide band modulating signal, for example a band width extending from 5 cycles per second to 100,000 cycles per second.

The carrier frequency generated by the oscillator including the tube 10 is stabilized by an automatic frequency control (AFC) system including a variable reactance diode 61 effectively in parallel with the capacitor 17. The variable reactance diode 61 is, preferably, completely back-biased through a resistor 65 from a connection 67. A resistor 70 in conjunction with the resistor 65 provides a voltage divider. A capacitor 62 is in series with the diode 61. The capacitor 62 is a blocking capacitor to isolate the diode 61 from the bias on the anode 24 of the oscillator tube 10. The diode 61, for example, may be a type 1N950.

The AFC system includes a mixer 63 which derives a control signal as a result of comparison between the frequency of a reference frequency oscillator 64 and the frequency of oscillations of the oscillator tube 10. The output of a buffer amplifier tube 66 passes the frequency modulated output of the oscillator tube 10 (supplied from the anode 24 by a coupling capacitor 68 as shown to the control grid of tube 66) to an output connection 69 and to one input of a mixer 63. The output level of the mixer 63 controls a Schmitt trigger multivibrator 72 the output of which is amplified in a wide band amplifier 74, followed by a clipper 76, detector 78 and a D.C. amplifier 79. The output of the D.C. amplifier 79 is a direct current control voltage appearing in the conductor 81. The control voltage in the conductor 81 is proportional to the frequency error of the oscillator with a polarity depending on the direction of the error. This control voltage is applied to the anode of the diode 61. The capacitive reactance change of the diode 61 in response to the applied voltage adds to or subtracts from the capacitive value of the capacitor 17 to stabilize the frequency of the oscillator.

A switch 82 when closed defeats the AFC by directly grounding the anode of the diode 61. In normal AFC operation of the AFC diode 61 with applied voltage changes, the AFC diode 61 is returned to ground by way of a relatively large capacitor 83. A relatively small capacitor 86 grounds the diode for radio frequency at the oscillator frequency. The capacitor 86 is provided in addition to the capacitor 83, as the latter may be physically at a distance from the diode 61 when apparatus embodying the invention is installed.

The AFC diode 61 provides a convenient means for additionally frequency modulating the carrier output of the oscillator 10 by a superaudible subcarrier introduced at a terminal 88. This superaudible subcarrier is frequency modulated by subsidiary program material and is separately recoverable from the usual receiver discriminator for further demodulation at a receiving point. FM subcarrier communication is discussed in U.S. Patent No. 3,005,167, granted October 17, 1961 to Bott et al. The subcarrier voltage is reduced by voltage divider resistors 91 and 92. Capacitor 93 is a D.C. blocking capacitor between the terminal 88 and the diode 61.

By way of example, the capacitors in the single figure of the drawing may have the following values:

| | | |
|---|---|---|
| Capacitor **14** | mmf | 28 |
| Capacitor **16** | mmf | 220 |
| Capacitor **17** | mmf | 47 |
| Capacitor **34** | mfd | 2.2 |
| Capacitor **41** | mmf | 1.5–7 |
| Capacitor **56** | mfd | .68 |
| Capacitor **62** | mmf | 100 |
| Capacitor **83** | mfd | 40 |
| Capacitor **86** | mmf | 1000 |

By way of example, the resistors may have the following values for the named component parts:

| | | |
|---|---|---|
| Resistor **23** | ohms | 15K |
| Resistor **48** | ohms | 5K |
| Resistor **49** | ohms | 15K |
| Resistor **53** | ohms | 33K |
| Resistor **65** | ohms | 180K |
| Resistor **70** | ohms | 100K |

By way of example, the following voltages, positive with respect to ground are present during operation at the named terminals: terminal 29, 87 volts; terminal 51, 86 volts; and terminal 67, 86 volts. Also, by way of example, the carrier frequency generated by the oscillator is in the neighborhood of 44 to 54 megacycles per second for the component values also given by way of example.

What is claimed is:

1. A radio frequency oscillator comprising:
an electronic device having an input electrode,
an output electrode and a common electrode,
circuit means including a resonant frequency determining circuit coupling said output electrode to said input electrode to sustain oscillations,
a capacitive voltage divider coupled between said output electrode and said input electrode,
a connection from a point intermediate the ends of said voltage divider to said common electrode,
means including a variable reactance solid state electronic device and having electric current rectifying properties coupled between said frequency determining circuit and said common electrode to effect frequency modulation of said oscillator,
a source of modulating signals,
means coupling said source to said variable reactance device, and
means to develop a back bias voltage across said variable reactance device except during a part of the radio frequency cycle whereupon said diode conducts whereby to cause said modulating signals to vary both the reactance and resistance of said variable reactance device to effect frequency modulation of said oscillator.

2. A radio frequency oscillator comprising:
an electronic device having an input electrode,
an output electrode and a common electrode,
circuit means including a resonant frequency determining circuit coupling said output electrode to said input electrode to sustain oscillations,
a capacitive voltage divider coupled between said output electrode and said input electrode,
a connection from a point intermediate the ends of said voltage divider to said common electrode, means including a variable reactance solid state electronic device having electric current rectifying properties coupled between said frequency determining circuit and said common electrode to effect frequency modulation of said oscillator, a source of modulating signals, means coupling said source to said variable reactance device, and means acting in conjunction with said rectifying properties to apply a back bias voltage to said variable reactance device except during a part of the radio frequency cycle whereupon said diode conducts whereby to cause said modulating signals to vary both the reactance and resistance of said variable reactance device to effect frequency modulation of said oscillator.

References Cited by the Examiner

UNITED STATES PATENTS

| | | | |
|---|---|---|---|
| 2,771,584 | 11/1956 | Thomas. | |
| 2,964,637 | 12/1960 | Keizer | 332—30 |
| 3,046,496 | 7/1962 | Trevor | 332—30 X |

FOREIGN PATENTS

| | | |
|---|---|---|
| 876,002 | 8/1961 | Great Britain. |

OTHER REFERENCES

Hedderly: "Parametric Amplification by Charge Storage," Proc. I.R.E., May 1961, p. 967.

NATHAN KAUFMAN, *Primary Examiner.*

A. L. BRODY, *Assistant Examiner.*

UNITED STATES PATENT OFFICE
CERTIFICATE OF CORRECTION

Patent No. 3,293,571 Dated December 20, 1966

Inventor(s) Adolf H. Bott

It is certified that error appears in the above-identified patent and that said Letters Patent are hereby corrected as shown below:

Column 4, line 61, change "diode" to --variable reactance device--.

Column 5, line 12, change "diode" to --variable reactance device--.

Signed and sealed this 12th day of June 1973.

(SEAL)
Attest:

EDWARD M.FLETCHER,JR.
Attesting Officer

ROBERT GOTTSCHALK
Commissioner of Patents